(12) United States Patent
Isobe

(10) Patent No.: US 12,033,985 B2
(45) Date of Patent: Jul. 9, 2024

(54) DISPLAY UNIT AND ELECTRONIC APPARATUS

(71) Applicant: SONY SEMICONDUCTOR SOLUTIONS CORPORATION, Kanagawa (JP)

(72) Inventor: Hiroshi Isobe, Kanagawa (JP)

(73) Assignee: SONY SEMICONDUCTOR SOLUTIONS CORPORATION, Tokyo (JP)

( * ) Notice: Subject to any disclaimer, the term of this patent is extended or adjusted under 35 U.S.C. 154(b) by 1014 days.

(21) Appl. No.: 16/961,816

(22) PCT Filed: Jan. 16, 2019

(86) PCT No.: PCT/JP2019/001088
§ 371 (c)(1),
(2) Date: Jul. 13, 2020

(87) PCT Pub. No.: WO2019/150949
PCT Pub. Date: Aug. 8, 2019

(65) Prior Publication Data
US 2021/0074688 A1 Mar. 11, 2021

(30) Foreign Application Priority Data

Jan. 30, 2018 (JP) ................. 2018-013840

(51) Int. Cl.
*H01L 25/075* (2006.01)
*H01R 12/57* (2011.01)
*H05K 1/18* (2006.01)

(52) U.S. Cl.
CPC ......... *H01L 25/0753* (2013.01); *H01R 12/57* (2013.01); *H05K 1/181* (2013.01); *H05K 2201/10106* (2013.01); *H05K 2201/10189* (2013.01); *H05K 2201/2009* (2013.01)

(58) Field of Classification Search
CPC ............. H01R 12/57; H05K 1/181; H05K 2201/10106; H05K 2201/10189; H05K 2201/2009
See application file for complete search history.

(56) References Cited

U.S. PATENT DOCUMENTS

2017/0077436 A1    3/2017   Yue et al.

FOREIGN PATENT DOCUMENTS

| CN | 106104660 A | 11/2016 |
|---|---|---|
| JP | 05-84979 U | 11/1993 |
| JP | 06-019405 A | 1/1994 |
| JP | 08-123337 A | 5/1996 |

(Continued)

OTHER PUBLICATIONS

International Search Report and Written Opinion of PCT Application No. PCT/JP2019/001088, dated Feb. 26, 2019, 10 pages of ISRWO.

*Primary Examiner* — Anne M Hines
(74) *Attorney, Agent, or Firm* — CHIP LAW GROUP

(57) ABSTRACT

A display unit includes a substrate having a first surface and a second surface opposed to each other, a plurality of light emitting devices provided on the first surface of the substrate, a mounting member provided in a selective region of the second surface of the substrate, a base that is provided to be opposed to the substrate and has an opening through which the mounting member is inserted with a gap therebetween, and a rigid member that is provided in the gap and is in contact with the base and the mounting member.

13 Claims, 10 Drawing Sheets

(56) References Cited

FOREIGN PATENT DOCUMENTS

| | | |
|---|---|---|
| JP | 2006-049443 A | 2/2006 |
| JP | 2015-184542 A | 10/2015 |
| JP | 2016-161743 A | 9/2016 |
| WO | 2015/146274 A1 | 10/2015 |

[FIG. 1]
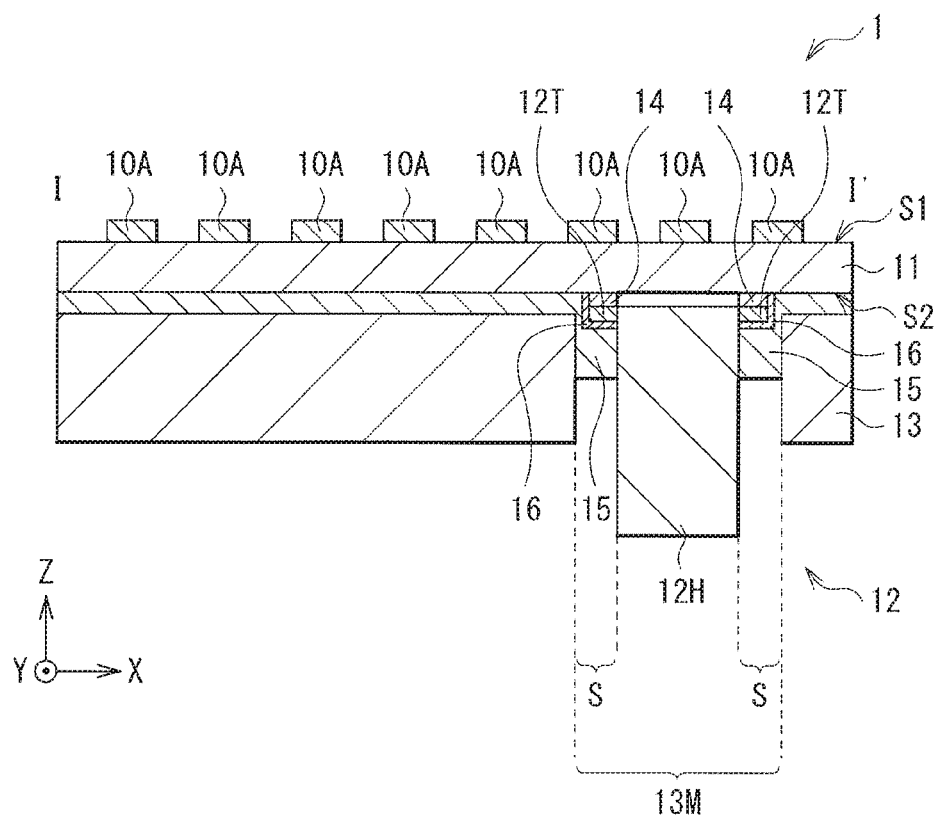
[FIG. 2]
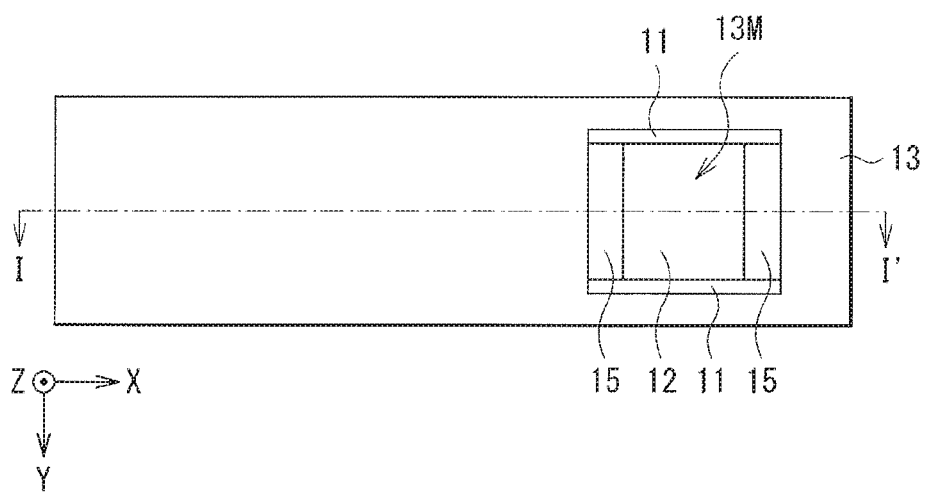

[ FIG. 3 ]
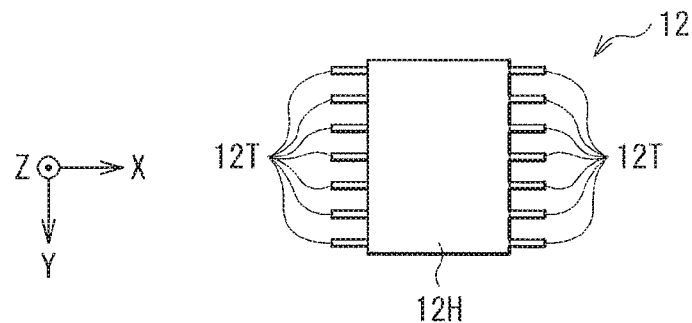
[ FIG. 4A ]
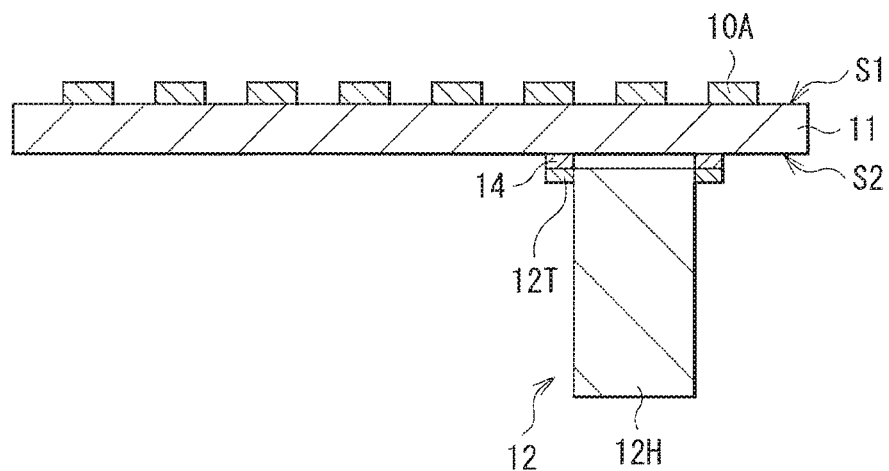
[ FIG. 4B ]
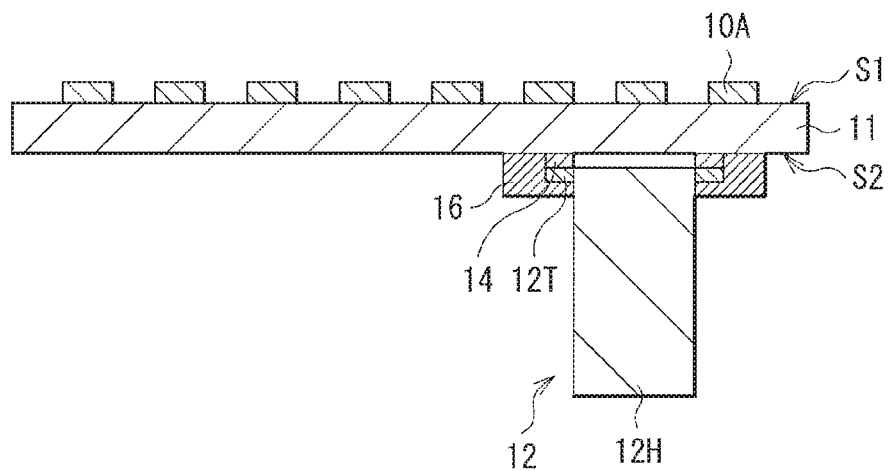

[FIG. 4C]
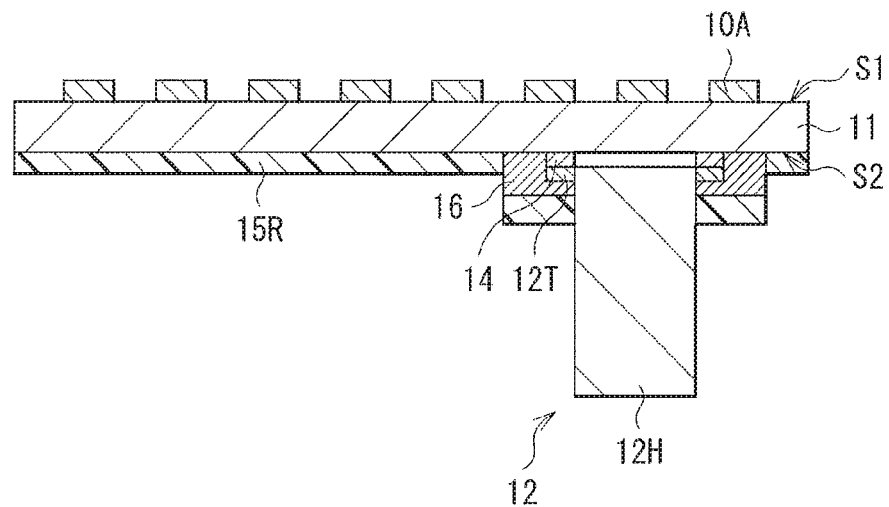
[FIG. 4D]
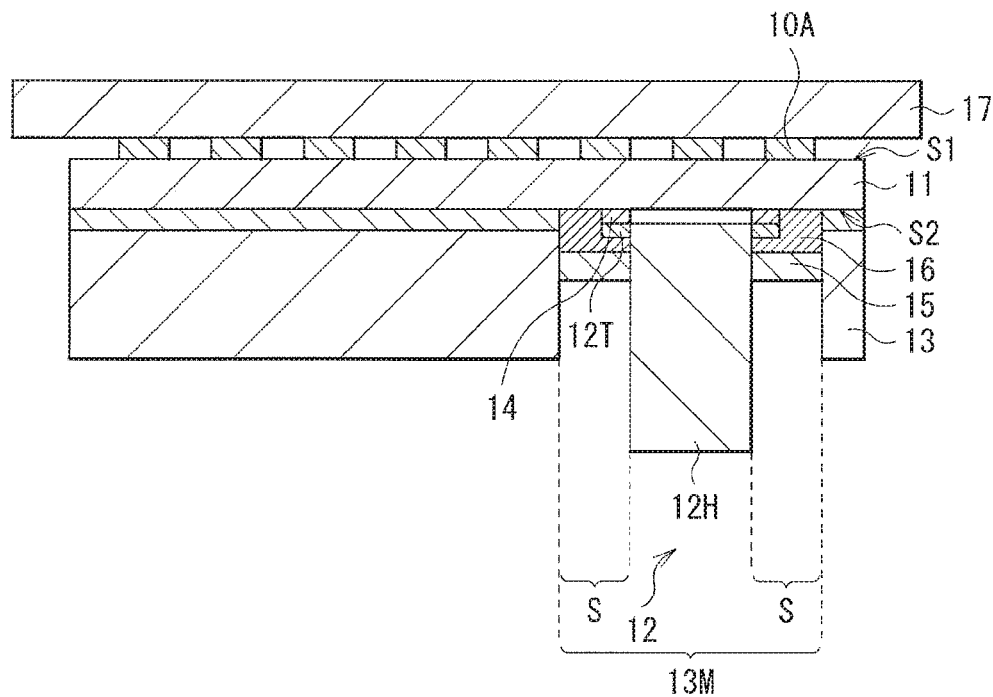

[FIG. 5]
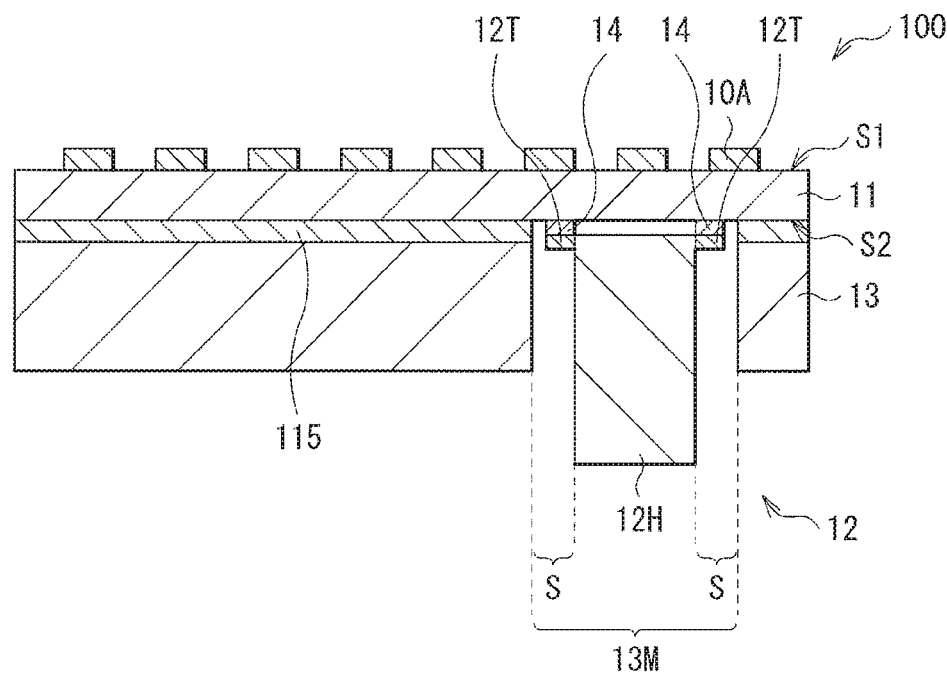
[FIG. 6]
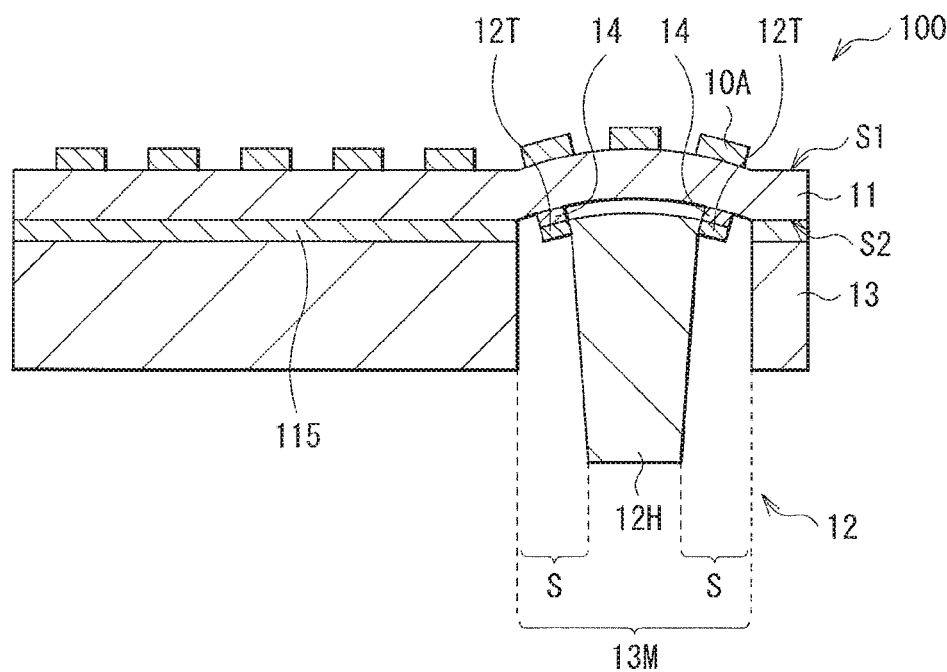

[ FIG. 7 ]
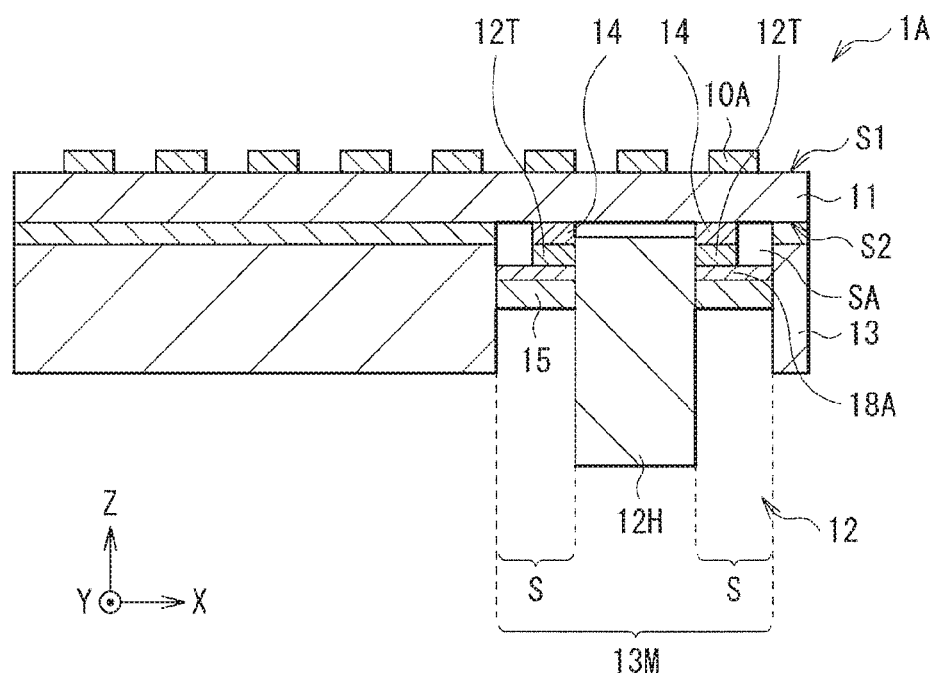
[ FIG. 8 ]
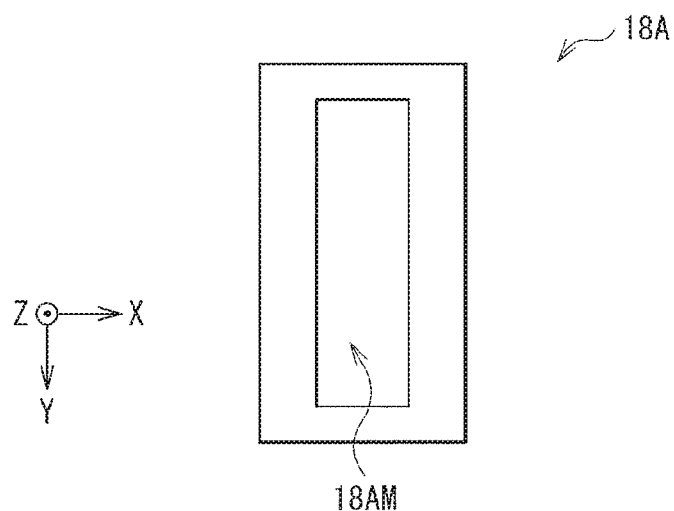

[FIG. 9]
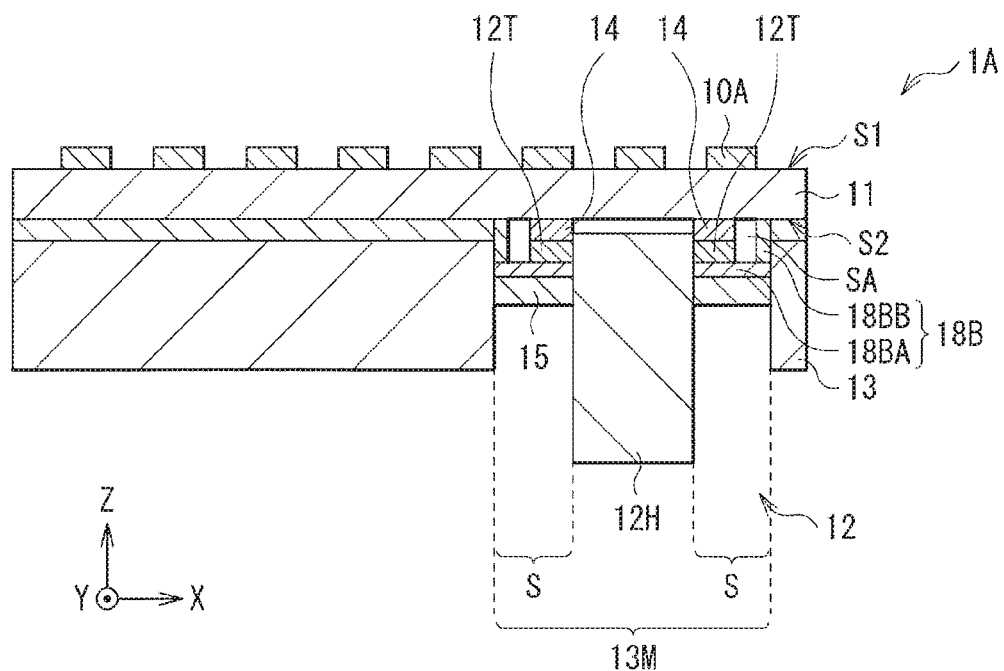

[ FIG. 10A ]
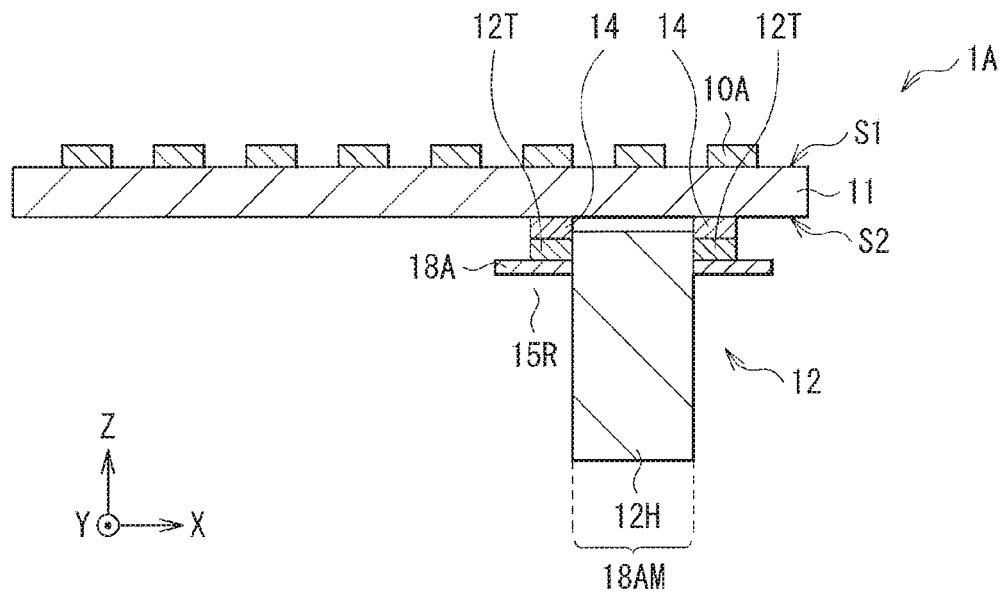
[ FIG. 10B ]
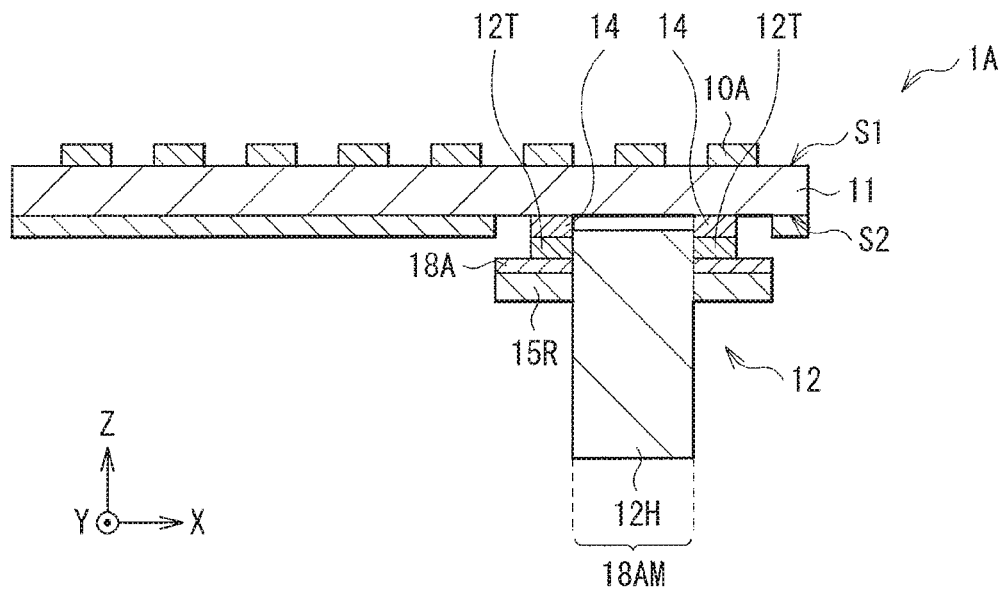

[ FIG. 11 ]
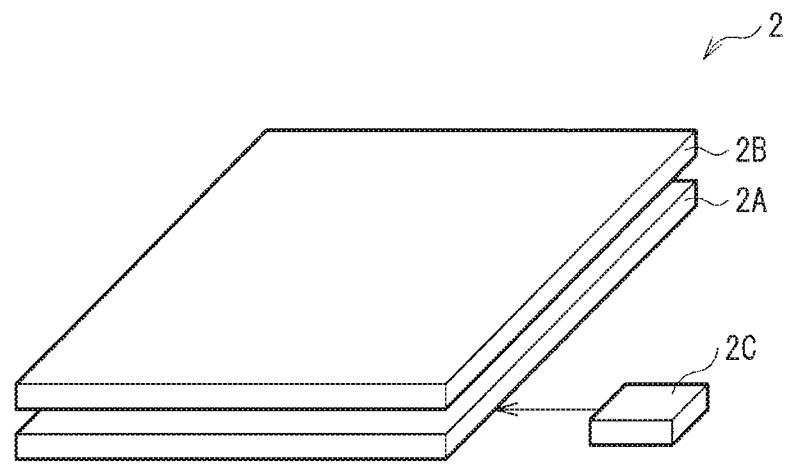
[ FIG. 12 ]
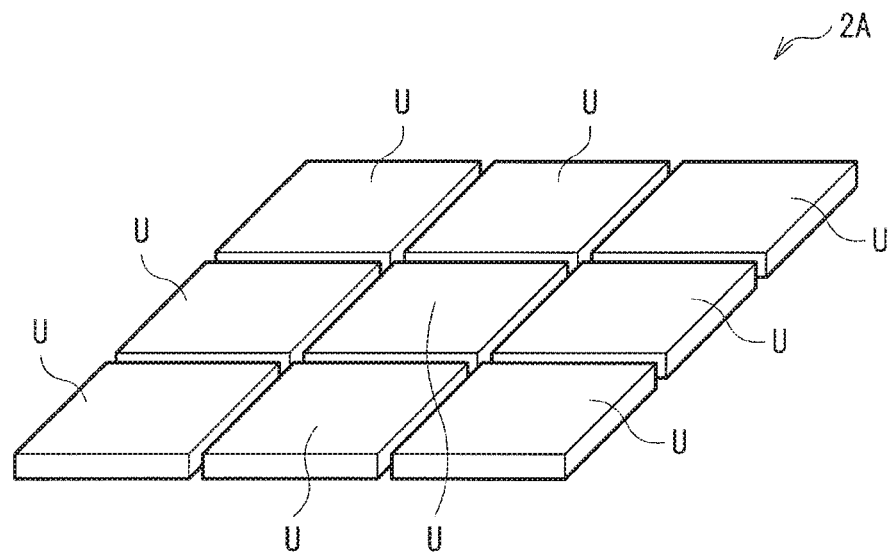

[ FIG. 13 ]
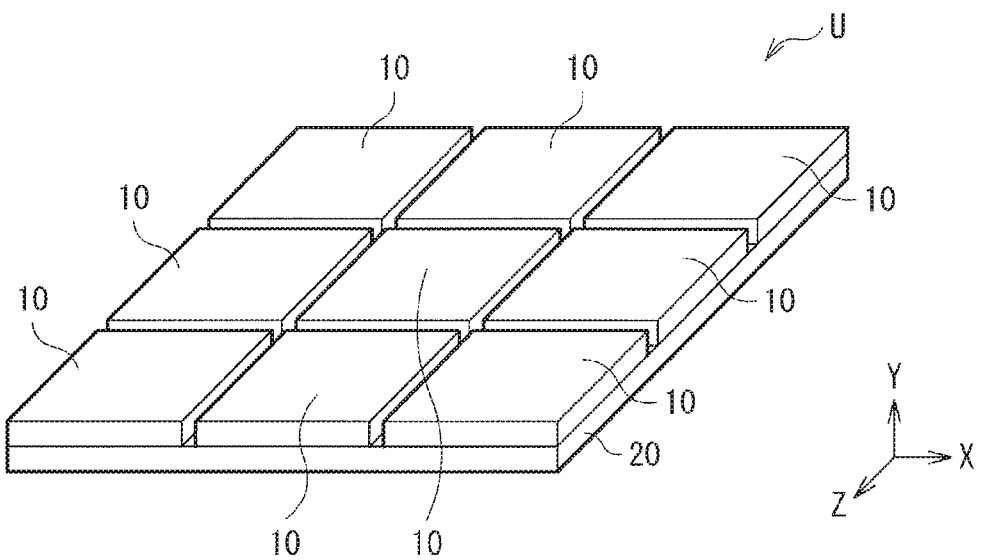
[ FIG. 14 ]
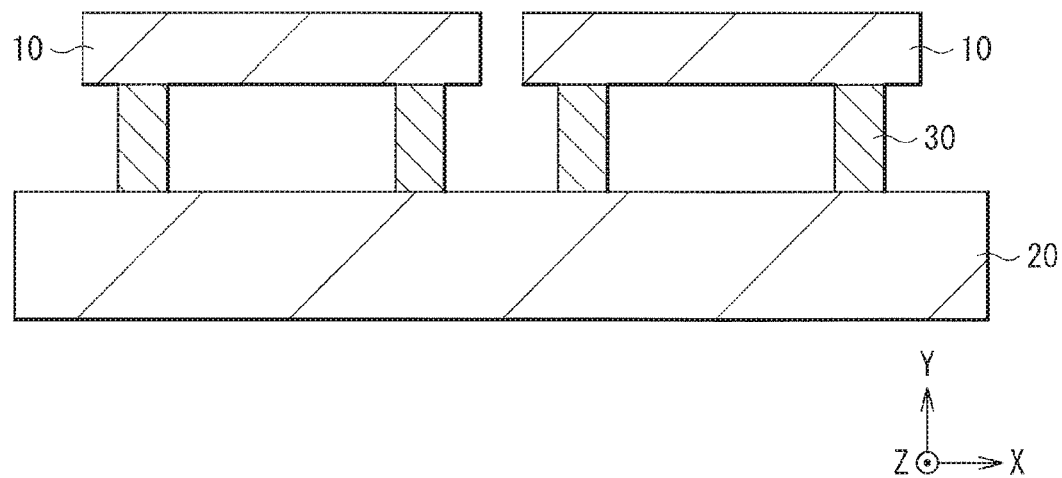

[ FIG. 15 ]
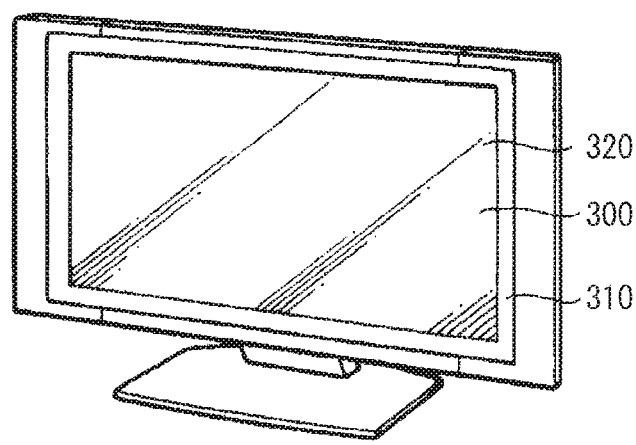
[ FIG. 16 ]
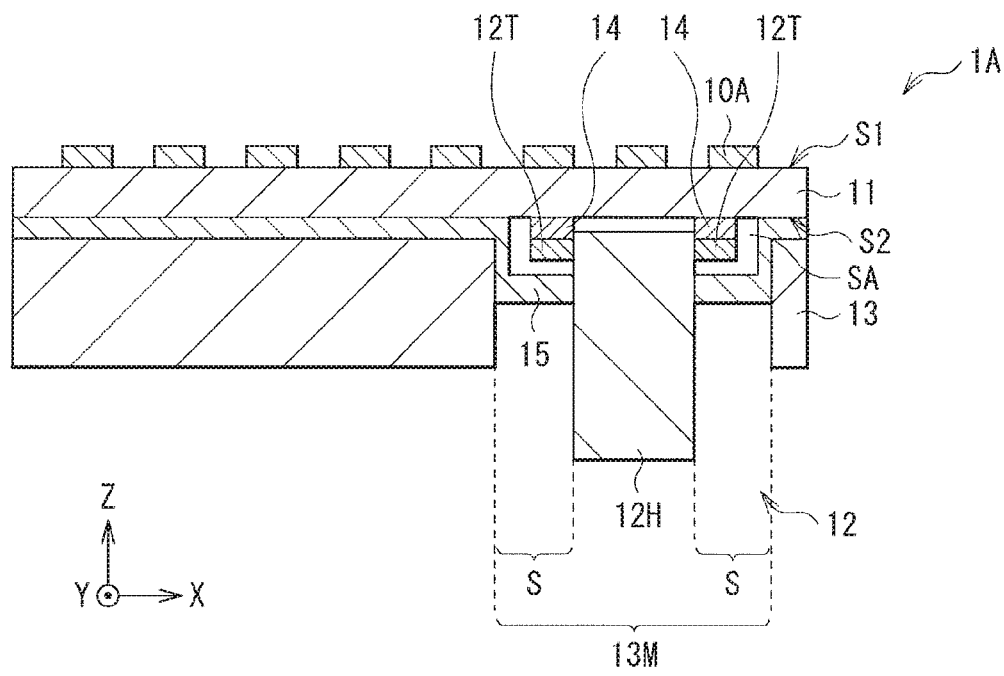

DISPLAY UNIT AND ELECTRONIC APPARATUS

CROSS REFERENCE TO RELATED APPLICATIONS

This application is a U.S. National Phase of International Patent Application No. PCT/JP2019/001088 filed on Jan. 16, 2019, which claims priority benefit of Japanese Patent Application No. JP 2018-013840 filed in the Japan Patent Office on Jan. 30, 2018. Each of the above-referenced applications is hereby incorporated herein by reference in its entirety.

TECHNICAL FIELD

The present disclosure relates to a display unit and an electronic apparatus including a mounting component, for example, a connector or the like on a rear surface of a substrate on which an element is provided.

BACKGROUND ART

In recent years, a display unit (a tiling display) in which a plurality of display elements (hereinafter, referred to as "cells") is arranged in a tiling manner has been proposed. In the tiling display, light emitting devices such as light emitting diodes (LEDs) are disposed side by side on a substrate cell by cell. There is an example in which, for example, a glass epoxy substrate is used as the substrate of the cells for reduction in cost and routing of a wiring line (Patent Literature 1).

CITATION LIST

Patent Literature

PTL 1: Japanese Unexamined Patent Application Publication No. 2016-161743

SUMMARY OF THE INVENTION

A glass epoxy substrate or the like is easily warped. The warpage of the substrate deteriorates image quality. Therefore, it is desirable to provide a display unit and an electronic apparatus that are able to suppress the deterioration of image quality caused by the warpage of the substrate.

A display unit according to an embodiment of the present disclosure includes a substrate having a first surface and a second surface opposed to each other, a plurality of light emitting devices provided on the first surface of the substrate, a mounting member provided in a selective region of the second surface of the substrate, a base that is provided to be opposed to the substrate and has an opening through which the mounting member is inserted with a gap therebetween, and a rigid member that is provided in the gap and is in contact with the base and the mounting member.

An electronic apparatus according to an embodiment of the present disclosure includes the display unit according to the above embodiment of the present disclosure.

In the display unit or the electronic apparatus according to the embodiment of the present disclosure, because the rigid member is provided in the opening of the base, warpage of the substrate that occurs in the vicinity of a portion thereof coupled to the mounting member is suppressed.

According to the display unit and the electronic apparatus of the respective embodiments of the present disclosure, the provision of the rigid member in the opening of the base makes local warpage of the substrate less likely to occur, thus making it possible to suppress distortion of a screen. Therefore, it is possible to suppress the deterioration of image quality caused by warpage of the substrate.

Effects of the present disclosure are not limited to those described above and may be other different effects or may further include other effects.

BRIEF DESCRIPTION OF DRAWING

FIG. 1 is a cross-sectional schematic diagram illustrating a configuration of a main portion of a display unit according to an embodiment of the present disclosure.

FIG. 2 is a schematic diagram illustrating a planar configuration of a rear surface side of the display unit illustrated in FIG. 1.

FIG. 3 is a planar schematic diagram illustrating an example of a configuration of a mounting member illustrated in FIG. 1.

FIG. 4A is a cross-sectional schematic diagram illustrating a process of a method for manufacturing the display unit illustrated in FIG. 1.

FIG. 4B is a cross-sectional schematic diagram illustrating a process subsequent to FIG. 4A.

FIG. 4C is a cross-sectional schematic diagram illustrating a process subsequent to FIG. 4B.

FIG. 4D is a cross-sectional schematic diagram illustrating a process subsequent to FIG. 4C.

FIG. 5 is a cross-sectional schematic diagram illustrating a configuration of a main portion of a display unit according to a comparative example.

FIG. 6 is a cross-sectional schematic diagram illustrating a state where a substrate illustrated in FIG. 5 is warped.

FIG. 7 is a cross-sectional schematic diagram illustrating a configuration of a main portion of a display unit according to a modification example.

FIG. 8 is a planar schematic diagram illustrating a configuration of a protection member illustrated in FIG. 7.

FIG. 9 is a cross-sectional schematic diagram illustrating another example (1) of the display unit illustrated in FIG. 7.

FIG. 10A is a cross-sectional schematic diagram illustrating a process of a method for manufacturing the display unit illustrated in FIG. 7.

FIG. 10B is a cross-sectional schematic diagram illustrating a process subsequent to FIG. 10A.

FIG. 11 is an exploded perspective diagram illustrating a configuration of a display unit according to an application example of the display unit illustrated in FIG. 1 or the like.

FIG. 12 is a perspective diagram illustrating an outline configuration of an element substrate illustrated in FIG. 11.

FIG. 13 is a perspective diagram illustrating an outline configuration of a unit illustrated in FIG. 12.

FIG. 14 is a cross-sectional schematic diagram illustrating an outline configuration of the unit illustrated in FIG. 13.

FIG. 15 is a perspective diagram illustrating an exterior appearance of an electronic apparatus (a television set) according to the application example.

FIG. 16 is a cross-sectional schematic diagram illustrating still another example (2) of the display unit illustrated in FIG. 7.

MODES FOR CARRYING OUT THE INVENTION

Hereinafter, an embodiment of the present disclosure will be described in detail with reference to the drawings. Note that the description will be made in the following order.

1. Embodiment (Example of Display Unit Having Rigid Member in Opening of Base)
2. Modification Example (Example in Which Protection Member Is Provided between Rigid Member And Terminal)
3. Application Example (Tiling Display And Electronic Apparatus)

Embodiment

[Configuration]

FIG. 1 illustrates a schematic cross-sectional configuration of a main portion of a display unit (a display unit 1) according to an embodiment of the present disclosure. The display unit 1 displays a video on the basis of an externally inputted image signal. The display unit 1 includes a plurality of light emitting devices 10A provided on a surface (a first surface, a first surface S1) of a substrate 11, a mounting member 12 attached (mounted) to a selective region of a rear surface (a second surface, a second surface S2) of the substrate 11, and a base 13 that supports the substrate 11 from the second surface S2 side. The mounting member 12 includes a terminal 12T on a surface thereof opposed to the substrate 11, and the terminal 12T is electrically coupled to the substrate 11 via a solder layer 14.

FIG. 2 illustrates a schematic planar configuration of a rear surface (base 13) side of the main portion of the display unit 1. A cross-sectional configuration along a line I-I' in FIG. 2 corresponds to FIG. 1. The base 13 has an opening 13M through which the mounting member 12 is inserted, and the mounting member 12 is provided to project from the base 13. In the opening 13M of the base 13, a rigid member 15 and a buffer member 16 are provided (FIGS. 1 and 2).

The light emitting devices 10A each include a single chip including, for example, a light emitting diode (LED). The light emitting devices 10A are disposed on the first surface S1 of the substrate 11 at predetermined pitches in a matrix, for example.

The substrate 11 has the first surface S1 and the second surface S2 opposed to each other. It is desirable that the substrate 11 include, for example, a glass epoxy resin. One reason for this is that the glass epoxy resin is inexpensive and facilitates routing of a wiring line. The glass epoxy resin is easily affected by a change in temperature (or humidity), and susceptible to deformation such as warpage. However, in the present embodiment, as described later, it is possible to suppress such deformation, and therefore the inexpensive glass epoxy resin is suitably usable as the substrate 11. However, a constituent material of the substrate 11 is not limited to the glass epoxy resin, and other various materials (for example, glass and the like) are usable.

FIG. 3 illustrates a schematic planar configuration of the mounting member 12. The mounting member 12 is, for example, a connector such as a power supply connector, and includes a plurality of the terminals 12T and a housing 12H that houses the plurality of terminals 12T. The housing 12H extends in a stacking direction of the substrate 11 and the base 13 (the Z direction in FIG. 1) and projects from the base 13. The terminal 12T is exposed from a surface of the housing 12H opposed to the substrate 11 and extends in a predetermined direction (for example, the X direction in FIG. 3). The terminal 12T is physically coupled to a selective region of the substrate 11 by the solder layer 14. Furthermore, the terminal 12T is electrically coupled to the substrate 11 by the solder layer 14. The solder layer 14 is provided between the terminal 12T and the substrate 11. The coupling between the terminal 12T and the substrate 11 may be established by using, for example, an ACF (Anisotropic Conductive Film) or the like instead of the solder layer 14.

The mounting member 12 is inserted through the opening 13M provided in a selective region of the base 13. The base 13 is a substantially plate-shaped member provided to be opposed to the substrate 11 and is bonded to the second surface S2 of the substrate 11. The base 13 supports and reinforces the substrate 11. It is desirable that the base 13 include a material having higher rigidity than the substrate 11. Examples of a constituent material of the base 13 include aluminum (Al), iron (Fe), CFRP (Carbon Fiber Reinforced Plastics: carbon fiber reinforced plastics), etc. A thickness of the base 13 is larger than, for example, a thickness of the substrate 11.

In the base 13, the opening 13M provided in the region opposed to the mounting member 12 has a sufficient size with respect to the mounting member 12, and a gap S is provided between a peripheral edge of the opening 13M and the mounting member 12 (the housing 12H). In other words, the mounting member 12 is inserted through the opening 13M of the base 13 with the gap S therebetween. The opening 13M has, for example, a quadrilateral planar (the XY plane in FIG. 2) shape (FIG. 2).

In the present embodiment, the rigid member 15 is provided in the gap S of the opening 13M, and the rigid member 15 is in contact with the housing 12H of the mounting member 12 and the base 13. That is, the mounting member 12 is fixed to the base 13 via the rigid member 15. As described in detail later, warpage of the substrate 11 at a portion thereof coupled to the mounting member 12, that is, a portion near the solder layer 14, is suppressed.

The rigid member 15 is provided, for example, apart from the terminal 12T and the solder layer 14, and the buffer member 16 is interposed between the rigid member 15 and each of the terminal 12T and the solder layer 14. It is not necessary to provide the rigid members 15 in all the gaps S, and for example, the rigid members 15 are provided in the gaps S that are opposed to each other in a predetermined direction (the X direction in FIGS. 1 and 2) with the mounting member 12 therebetween. For example, the rigid members 15 may be provided to surround the mounting member 12 by providing the rigid members 15 in the gaps S that are opposed to each other in the Y direction in FIGS. 1 and 2.

A thickness (a dimension in the Z direction in FIG. 1) of the rigid member 15 with which the gap S is filled may be smaller than the thickness of the base 13. It is preferable that a sufficient area of the rigid member 15 be in contact with the base 13 and the mounting member 12.

The rigid member 15 preferably has a Young's modulus of 2 GPa or more. The rigid member 15 includes, for example, a resin material (a first resin material) such as an epoxy-based resin, an acrylic-based resin, a silicone-based resin, or an urethane-based resin. The rigid member 15 may include solder. Alternatively, the material of the rigid member 15 is not limited to the resin material or solder, and the rigid member 15 may include other organic material, inorganic material, or the like. The rigid member 15 is provided, for example, between the base 13 and the substrate 11 and functions as an adhesion layer used to bond the base 13 and the substrate 11 together. The rigid member 15 between the base 13 and the substrate 11 is provided to be continuous from the gap S in the opening 13M.

For example, the buffer member 16 is provided between the rigid member 15 and the terminal 12T of the mounting member 12. The buffer member 16 is in contact with the terminal 12T and the solder layer 14 from between the rigid member 15 and the terminal 12T, and is provided around the terminal 12T and the solder layer 14. In other words, the buffer member 16 covers a surface and an end face of the terminal 12T and an end face of the solder layer 14, and is disposed between the rigid member 15 and each of the terminal 12T and the solder layer 14.

The buffer member 16 is provided for reducing a stress generated in the solder layer 14 due to the rigid member 15 and has a Young's modulus lower than the Young's modulus of the rigid member 15. It is preferable that the Young's modulus of the buffer member 16 be 60 MPa or less. The buffer member 16 includes, for example, a resin material (a second resin material) having a Young's modulus lower than the Young's modulus of the resin material included in the rigid member 15. Examples of such a resin material include a resin material such as an epoxy-based resin, an acrylic-based resin, a silicone-based resin, or an urethane-based resin. Alternatively, the material of the buffer member 16 is not limited to such a resin material, and the buffer member 16 may include other organic material, inorganic material, or the like.

[Manufacturing Method]

It is possible to manufacture such a display unit 1, for example, through the following process (FIGS. 4A, 4B, 4C, and 4D).

First, after forming the plurality of light emitting devices 10A on the first surface S1 of the substrate 11, as illustrated in FIG. 4A, the mounting member 12 is coupled to a predetermined region of the second surface S2 of the substrate 11 by using the solder layer 14. Next, as illustrated in FIG. 4B, a resin material, for example, is applied to cover the solder layer 14 and the terminal 12T of the mounting member 12, and is then cured. This forms the buffer member 16 that protects the terminal 12T and the solder layer 14.

After forming the buffer member 16, as illustrated in FIG. 4C, a resin material 15R for forming the rigid member 15 is applied onto the second surface S2 of the substrate 11 to cover the buffer member 16. Thereafter, the rigid member 15 is formed by curing the resin material 15R applied onto the buffer member 16. Subsequently, as illustrated in FIG. 4D, the base 13 is bonded to the substrate 11 with the resin material 15R therebetween, and the resin material 15R between the substrate 11 and the base 13 is cured. This allows the base 13 to adhere to the substrate 11. The process of bonding the substrate 11 and the base 13 together is performed, for example, with the substrate 11 along a flat surface of a jig 17. Through such processes, the display unit 1 illustrated in FIG. 1 is completed.

Workings and Effects

In the display unit 1, the plurality of light emitting devices 10A is disposed on the first surface S1 of the substrate 11, and the mounting member 12 is disposed to be opposed to a portion of the second surface S2 of the substrate 11. Because the display unit 1 includes the base 13 that supports the substrate 11 from the second surface S2 side, rigidity of the entire device increases, and a deformation of the substrate 11 such as warpage due to a change in the environment such as the temperature or the humidity is less likely to occur. Furthermore, a deformation of the substrate 11 caused by an increase in the temperature at the time of driving or a thermal stress or the like that is generated in the manufacturing process is also suppressed.

In the present embodiment, because the rigid member 15 is provided in the opening 13M of the base 13, warpage of the substrate 11 that occurs in the vicinity of a portion thereof coupled to the mounting member 12, that is, in the vicinity of the solder layer 14, is suppressed. Hereinafter, the workings and effects will be described by using a comparative example.

FIG. 5 illustrates a schematic cross-sectional configuration of a main portion of a display unit (a display unit 100) according to the comparative example. Similarly to the display unit 1, the display unit 100 includes the base 13 opposed to the substrate 11, and the mounting member 12 is inserted through the opening 13M of the base 13. In the display unit 100, a rigid member (the rigid member 15 in FIG. 1) is not provided in the gap S between the base 13 and the mounting member 12, and the gap S is, for example, an air layer. That is, the mounting member 12 is not fixed to the base 13. The display unit 100 is different from the display unit 1 in this respect.

In such a display unit 100, as illustrated in FIG. 6, there is a possibility that the substrate 11 is locally warped at a portion thereof in the vicinity of the portion coupled to the mounting member 12. The local warpage of the substrate 11 is likely to occur when the mounting member 12 is coupled to the substrate 11 by using the solder layer 14. One reason for this is that a linear expansion coefficient of the substrate 11 is largely different from a linear expansion coefficient of the mounting member 12 and the substrate 11 is affected by a thermal stress. Regarding the opening 13M, because the rigidity of the substrate 11 is not reinforced, deformation is likely to occur due to the effect of the thermal stress. This local warpage of the substrate 11 causes distortion of a screen (a display screen), resulting in deterioration of image quality.

In contrast to this, in the display unit 1, the mounting member 12 is fixed to the base 13 because the rigid member 15 in contact with the base 13 and the mounting member 12 is provided in the gap S between the base 13 and the mounting member 12. Specifically, in the display unit 1, the substrate 11 is integrated with the base 13 via the mounting member 12, and therefore the rigidity is enhanced also at the opening 13M. This suppresses local warpage of the substrate 11 in the vicinity of the portion coupled to the mounting member 12.

In this way, in the present embodiment, the provision of the rigid member 15 in the opening 13M of the base 13 makes local warpage of the substrate 11 less likely to occur, thus making it possible to suppress distortion of the screen. Therefore, it is possible to suppress the deterioration of image quality caused by warpage of the substrate 11.

Furthermore, in the display unit 1, the buffer member 16 having a Young's modulus lower than the Young's modulus of the rigid member 15 is provided between the rigid member 15 and each of the terminal 12T and the solder layer 14. This reduces the influence of the stress on the solder layer 14 caused by the rigid member 15, thus making it possible to suppress the occurrence of a crack or the like in the solder layer 14.

It is possible for the rigid member 15 and the buffer member 16 to include, for example, a resin material. This makes it possible to achieve the above effects while reducing cost.

Hereinafter, modification examples of the above embodiment will be described.

Components similar to those in the above embodiment are denoted with the same reference symbols, and descriptions thereof will be omitted as appropriate.

Modification Example 1

FIG. 7 illustrates a schematic cross-sectional configuration of a main portion of a display unit (a display unit 1A)

according to a modification example of the above embodiment. The display unit 1A includes a protection member (a protection member 18A), which is disposed substantially in parallel to the substrate 11, between the rigid member 15 and the terminal 12T. The terminal 12T and the solder layer 14 are surrounded by an air layer SA. Except for this point, the display unit 1A has a configuration and effects similar to those of the display unit 1 according to the above embodiment.

FIG. 8 illustrates an example of a planar shape of the protection member 18A. The protection member 18A is, for example, a plate-like member having a quadrilateral planar shape and has an opening 18AM through which the mounting member 12 is inserted. It is preferable that the protection member 18A have a size that is able to sufficiently cover the mounting member 12 (the terminal 12T). The opening 18AM provided in the protection member 18A has a quadrilateral planar shape. The protection member 18A includes a resin material such as polyimide (PI), for example. The protection member 18A is provided for suppressing adhesion of the resin material 15R to the solder layer 14 when the resin material 15R is applied onto the second surface S2 of the substrate 11 (refer to FIG. 10B described later). By providing the protection member 18A, the air layer SA is formed.

As illustrated in FIG. 9, the display unit 1A may include a protection member 18B instead of the protection member 18A. The protection member 18B has a main surface 18BA (corresponding to the protection member 18A in FIG. 8) between the rigid member 15 and the terminal 12T, and additionally, a side surface 18BB provided substantially perpendicular to the main surface 18BA. The main surface 18BA is disposed substantially in parallel to the substrate 11. The side surface 18BB is provided between the main surface 18BA and the substrate 11 and surrounds the terminal 12T and the solder layer 14. In other words, the side surface 18BB of the protection member 18B is provided between the rigid member 15 and the respective end faces of the terminal 12T and the solder layer 14. It is sufficient that the side surface 18BB is provided in a direction intersecting the main surface 18BA. The protection member 18B having such a side surface 18BB is able to more reliably suppress adhesion of the resin material 15R to the solder layer 14. The air layer SA is formed between the side surface 18BB and the respective end faces of the terminal 12T and the solder layer 14.

The air layer SA, instead of the buffer member (the buffer member 16 in FIG. 1) of the display unit 1, surrounds the terminal 12T and the solder layer 14. In other words, the air layer SA is provided between the rigid member 15 and the respective end faces of the terminal 12T and the solder layer 14. The air layer SA is a portion of the gap S.

The display unit 1A including the protection member 18A (or the protection member 18B) is manufactured as follows (FIGS. 10A and 10B), for example.

First, after the mounting member 12 is coupled to the second surface S2 of the substrate 11 as described in the above embodiment, the mounting member 12 is inserted through the opening 18AM of the protection member 18A as illustrated in FIG. 10A. This results in the protection member 18A being disposed to be opposed to the substrate 11 with the terminal 12T and the solder layer 14 therebetween.

After the protection member 18A is provided, as illustrated in FIG. 10B, the resin material 15R is applied onto the second surface S2 of the substrate 11 to cover the protection member 18A. At this time, because the terminal 12T and the solder layer 14 are covered with the protection member 18A, the resin material 15R is applied to be separate from the respective end faces of the terminal 12T and the solder layer 14. Thereafter, the base 13 is bonded to the substrate 11 with the resin material 15R therebetween, and the resin material 15R between the substrate 11 and the base 13 is cured. This allows the base 13 to adhere to the substrate 11, and forms the rigid member 15 in the opening 13M. A process of bonding the substrate 11 and the base 13 together is performed, for example, with the substrate 11 along a flat surface of a jig 17 (see FIG. 4D). Through such a process, the display unit 1A illustrated in FIG. 7 is completed.

In the display unit 1A, the rigid member 15 is provided in the opening 13M of the base 13 as in the display unit 1. This makes local warpage of the substrate 11 less likely to occur, thus making it possible to suppress distortion of the screen. Therefore, it is possible to suppress deterioration of image quality caused by warpage of the substrate 11. Furthermore, because the protection member 18A (or the protection member 18B) having a sufficient size is provided between the rigid member 15 and the terminal 12T, the air layer SA is formed around the terminal 12T and the solder layer 14. This reduces the influence of the stress on the solder layer 14 caused by the rigid member 15, thus making it possible to suppress the occurrence of a crack or the like in the solder layer 14.

Application Example (Tiling Display)

The display units 1 and 1A described in the above embodiment and the like may each be applied to, for example, a tiling display (a display unit 2 in FIG. 11 described later).

FIG. 11 schematically illustrates an overall configuration of the display unit 2 that is a tiling display. The display unit 2 includes, for example, an element substrate 2A, an opposed substrate 2B opposed to the element substrate 2A, and a control circuit 2C that drives the element substrate 2A. For example, a surface of the opposed substrate 2B (a surface opposite to a surface facing the element substrate 2A) is a video display surface. A center portion of the video display surface is a display region, and a portion around the center portion is a non-display region. The opposed substrate 2B transmits light having a wavelength in a visible region. The opposed substrate 2B includes, for example, a light transmissive material such as a glass substrate, a transparent resin substrate, and a transparent resin film.

FIG. 12 schematically illustrates an example of a configuration of the element substrate 2A illustrated in FIG. 11. The element substrate 2A includes a plurality of units (units U) arranged in a tiling manner. In FIG. 12, a case where the element substrate 2A includes nine units U is illustrated. However, the number of units U may be ten or more, or may be eight or less.

FIG. 13 schematically illustrates an example of a configuration of the unit U. The unit U includes, for example, a plurality of display panels 10 arranged in a tiling manner and a support substrate (a support substrate 20) of the display panels 10. For example, the display panel 10 includes the display unit 1 or 1A described in the above embodiment or the like. A surface of each display panel 10 opposite to a display surface thereof is opposed to the support substrate 20. The support substrate 20 includes, for example, a metal plate.

FIG. 14 schematically illustrates an example of a configuration between the display panel 10 and the support substrate 20. The display panel 10 is fixed to the support substrate 20, for example, by a fixing member (a fixing member 30).

In particular, in a case where LEDs are used as the light emitting devices 10A, the display units 1 and 1A are preferably used for such a tiling display or other large displays.

The display units 1 and 1A described in the above embodiment or the like may each be a display unit that displays a video on a center portion of the first surface S1 of the substrate 11.

(Electronic Apparatus)

Furthermore, the display units 1 and 1A described in the above embodiment and the like are applicable to, for example, electronic apparatuses in various fields that display externally inputted image signals or internally generated image signals as an image or a video, such as television sets, digital cameras, notebook personal computers, mobile terminals such as mobile phones, or video cameras. An example thereof is presented below.

FIG. 15 illustrates an exterior appearance of a television set to which the display unit 1 or 1A described in the above embodiment or the like is applied. The television set includes, for example, a video display screen 300 including a front panel 310 and a filter glass 320, and the display unit 1 or 1A is used for the video display screen 300.

The present technology has been described above with reference to the embodiment and the modification example as examples. However, the present technology is not limited to the embodiment and the like but may be modified in a variety of ways. For example, the material, thickness and the like of each part described in the above embodiment or the like are non-limiting, and other materials and thickness may be used.

Furthermore, in the above modification example, a case has been described where the display unit 1A includes the protection members 18A and 18B. However, the protection members may be omitted as long as the rigid member 15 is provided apart from the solder layer 14. For example, as illustrated in FIG. 16, the air layer SA around the terminal 12T and the solder layer 14 may be provided between the terminal 12T and the rigid member 15.

Furthermore, the light emitting device 10A may be an organic light emitting diode (OLED: Organic Light Emitting Diode).

Note that the effects described herein are merely exemplary and are non-limiting, and other effects may be achieved.

Note that it is possible for the present technology to have the following configurations.

(1)
A display unit including:
a substrate having a first surface and a second surface opposed to each other;
a plurality of light emitting devices provided on the first surface of the substrate;
a mounting member provided in a selective region of the second surface of the substrate;
a base that is provided to be opposed to the substrate and has an opening through which the mounting member is inserted with a gap therebetween; and
a rigid member that is provided in the gap and is in contact with the base and the mounting member.

(2)
The display unit according to (1), in which the mounting member includes a terminal that is electrically coupled to the substrate.

(3)
The display unit according to (2), further including a solder layer provided between the terminal and the substrate.

(4)
The display unit according to (3), in which the rigid member is provided apart from the solder layer.

(5)
The display unit according to (4), further including a buffer member provided between the terminal and the rigid member and having a Young's modulus lower than a Young's modulus of the rigid member.

(6)
The display unit according to (5), in which the buffer member is provided around the terminal and the solder layer and is in contact with the terminal and the solder layer.

(7)
The display unit according to (5) or (6), in which the rigid member includes a first resin material, and the buffer member includes a second resin material having a Young's modulus lower than that of the first resin material.

(8)
The display unit according to any one of (4) to (7), further including a protection member provided between the terminal and the rigid member.

(9)
The display unit according to (8), in which the protection member includes
a main surface provided between the terminal and the rigid member and in parallel to the substrate, and
a side surface provided between the main surface and the substrate and intersecting the main surface.

(10)
The display unit according to any one of (1) to (9), in which the rigid member is further provided between the base and the substrate.

(11)
The display unit according to any one of (1) to (10), in which the mounting member is a connector.

(12)
The display unit according to any one of (1) to (11), including a plurality of the substrates, in which the plurality of substrates is arranged in a tiling manner.

(13)
An electronic apparatus that includes a display unit,
the display unit including:
a substrate having a first surface and a second surface opposed to each other;
a plurality of light emitting devices provided on the first surface of the substrate;
a mounting member provided in a selective region of the second surface of the substrate;
a base that is provided to be opposed to the substrate and has an opening through which the mounting member is inserted with a gap therebetween; and
a rigid member that is provided in the gap and is in contact with the base and the mounting member.

The present application claims priority based on Japanese Patent Application No. 2018-13840 filed with the Japan Patent Office on Jan. 30, 2018, the entire content of which is incorporated herein by reference.

It should be understood that those skilled in the art would make various modifications, combinations, sub-combinations, and alterations depending on design requirements and other factors, and they are within the scope of the attached claims or the equivalents thereof.

The invention claimed is:

1. A display unit, comprising:
   a substrate that includes a first surface and a second surface opposed to the first surface;
   a plurality of light emitting devices on the first surface of the substrate;
   a mounting member in a selective region of the second surface of the substrate;
   a base opposed to the substrate, wherein
      the base includes an opening,
      the mounting member is inserted through the opening of the base, and
      the opening includes a gap between a periphery edge of the opening and the mounting member; and
   a rigid member in the gap of the opening, wherein the rigid member is in contact with the base and the mounting member.

2. The display unit according to claim 1, wherein the mounting member includes a terminal that is electrically coupled to the substrate.

3. The display unit according to claim 2, further comprising a solder layer between the terminal and the substrate.

4. The display unit according to claim 3, wherein the rigid member is apart from the solder layer.

5. The display unit according to claim 4, further comprising a buffer member between the terminal and the rigid member, wherein
   the buffer member has a Young's modulus lower than a Young's modulus of the rigid member.

6. The display unit according to claim 5, wherein
   the buffer member is around the terminal and the solder layer and
   the buffer member is in contact with the terminal and the solder layer.

7. The display unit according to claim 5, wherein
   the rigid member includes a first resin material,
   the buffer member includes a second resin material, and
   a Young's modulus of the second resin material is lower than a Young's modulus of the first resin material.

8. The display unit according to claim 4, further comprising a protection member between the terminal and the rigid member.

9. The display unit according to claim 8, wherein the protection member includes
   a main surface between the terminal and the rigid member, wherein the main surface is in parallel to the substrate, and
   a side surface between the main surface and the substrate, wherein the side surface intersects the main surface.

10. The display unit according to claim 1, wherein the rigid member is between the base and the substrate.

11. The display unit according to claim 1, wherein the mounting member is a connector.

12. The display unit according to claim 1, further comprising a plurality of substrates, wherein the plurality of substrates is in a tiling manner.

13. An electronic apparatus, comprising:
    a display unit, wherein the display unit comprises:
       a substrate that includes a first surface and a second surface opposed to the first surface;
       a plurality of light emitting devices on the first surface of the substrate;
       a mounting member in a selective region of the second surface of the substrate;
       a base opposed to the substrate, wherein
          the base includes an opening,
          the mounting member is inserted through the opening of the base, and
          the opening includes a gap between a periphery edge of the opening and the mounting member; and
       a rigid member in the gap of the opening, wherein the rigid member is in contact with the base and the mounting member.

* * * * *